(12) United States Patent
De Gouy et al.

(10) Patent No.: US 7,180,974 B2
(45) Date of Patent: Feb. 20, 2007

(54) FREQUENCY DIVISION METHOD AND DEVICE

(75) Inventors: Jean-Luc De Gouy, Briis Sous Forges (FR); Pascal Gabet, Cholet (FR)

(73) Assignee: Thales, Neuilly s/Seine (FR)

( * ) Notice: Subject to any disclaimer, the term of this patent is extended or adjusted under 35 U.S.C. 154(b) by 0 days.

(21) Appl. No.: 11/037,460

(22) Filed: Jan. 19, 2005

(65) Prior Publication Data

US 2005/0180539 A1    Aug. 18, 2005

(30) Foreign Application Priority Data

Jan. 20, 2004  (FR)  ................................. 04 00495

(51) Int. Cl.
*H03K 21/00* (2006.01)
(52) U.S. Cl. ........................... 377/48; 327/117
(58) Field of Classification Search ............. None
See application file for complete search history.

(56) References Cited

U.S. PATENT DOCUMENTS

| | | | |
|---|---|---|---|
| 4,241,308 A * | 12/1980 | Lovelace et al. | ........... 327/114 |
| 4,357,527 A | 11/1982 | Kojima | |
| 4,546,331 A * | 10/1985 | DaSilva et al. | ............. 332/128 |
| 5,150,082 A * | 9/1992 | Grimmett et al. | ........... 332/128 |
| 5,530,407 A * | 6/1996 | Yabe et al. | .................... 331/44 |
| 5,834,987 A * | 11/1998 | Dent | .......................... 332/127 |
| 6,035,182 A * | 3/2000 | Shurboff | ..................... 455/216 |
| 6,614,870 B1 | 9/2003 | Miller | |
| 2002/0186808 A1 | 12/2002 | Kouznetsov | |

* cited by examiner

*Primary Examiner*—Timothy P. Callahan
*Assistant Examiner*—Cassandra Cox
(74) *Attorney, Agent, or Firm*—Lowe Hauptman & Berner, LLP

(57) ABSTRACT

A method and device of frequency division with a division ratio: comprising: an input divider with a division ratio NPs receiving the frequency Fe at input and delivering a signal to an insertion/substitution divider, the insertion/substitution divider having an input of variation of the division ratio, delivering a command frame to the input divider and generating an end-of-count signal, the insertion/substitution divider being adapted to the insertion of one or more input divider cycles and/or the substitution of an input divider cycle in the command frame.

15 Claims, 10 Drawing Sheets

--Prior Art--

FIG.3 —Prior Art—

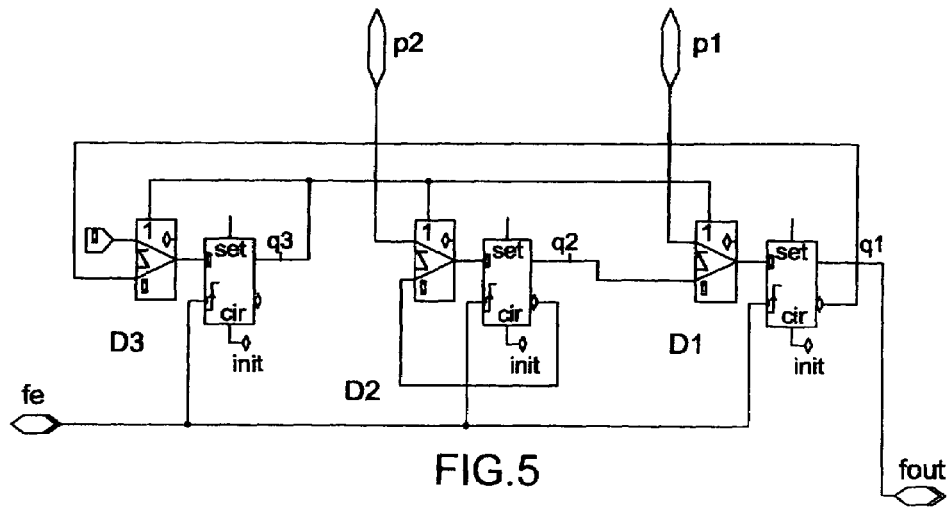

FIG.5

| NPS DIVISION RATIO | DURATION OF THE HIGH STATE EXPRESSED IN NUMBER OF PERIODS OF THE INPUT SIGNAL | DURATION OF THE LOW STATE EXPRESSED IN NUMBER OF PERIODS OF THE INPUT SIGNAL |
|---|---|---|
| 2 | 1 | 1 |
| 3 | 2 | 1 |
| 4 | 3 | 1 |

TABLE GIVING THE DURATION OF THE HIGH AND LOW STATES FOR A 2/3/4 PRESCALER ACCORDING TO THE INVENTION

FIG.6A

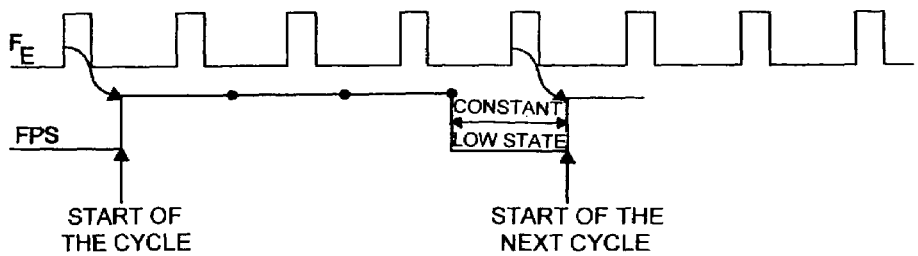

TIMING DIAGRAM FOR NPS = 4 SHOWING THAT THE CONSTANT LOW STATE IS LOCATED AT THE END OF THE PRESCALER CYCLE

FIG.6B

| ΔN | DURATION OF THE PRESCALER CYCLE BEFORE SUBSTITUTION (EXPRESSED IN PERIODS OF Fe) | SUBSTITUTION | INSERTION | DURATION OF THE SUBSTITUTED PRESCALER CYCLE (EXPRESSED IN PERIODS OF Fe) | DURATION OF THE ADDITIONAL PRESCALER CYCLE (EXPRESSED IN PERIODS OF Fe) |
|---|---|---|---|---|---|
| 0 | 2 | NO | NO | 2 | 0 |
|   | 3 | NO | NO | 3 | 0 |
|   | 4 | NO | NO | 4 | 0 |
| 1 | 2 | YES | YES | 3 | 0 |
|   | 3 | YES | NO | 4 | 0 |
|   |   | YES | YES | 2 | 2 |
|   | 4 | YES | YES | 3 | 2 |
| 2 | 2 | NO | YES | 2 | 2 |
|   | 3 | NO | YES | 3 | 2 |
|   | 4 | NO | YES | 4 | 2 |
| 3 | 2 | NO | YES | 2 | 3 |
|   | 3 | NO | YES | 3 | 3 |
|   | 4 | NO | YES | 4 | 3 |
| 4 | 2 | NO | YES | 2 | 4 |
|   | 3 | NO | YES | 3 | 4 |
|   | 4 | NO | YES | 4 | 4 |

FIG.10

FREQUENCY DIVISION METHOD AND DEVICE

RELATED APPLICATIONS

The present application is based on, and claims priority from French Application Number 0400495, filed Jan. 20, 2004, the disclosure of which is hereby incorporated by reference herein in its entirety.

BACKGROUND OF THE INVENTION

1. Field of the Invention

The invention relates to a frequency divider.

It can be applied, for example, to the field of frequency synthesis where the phase noise of the divider is a key performance characteristic.

In its general principle, a frequency divider with a division ratio N enables the output generation of a signal with a duration $N*T_e$ where $T_e$ is the period of the input signal of the divider. The output signal with a duration $N*T_e$ is generally constituted by only one high state and only one low state When a divider is placed in a phase-locked loop, the static modification, in steps of one, of the N division ratio generates frequency steps at output of the loop. These steps are spaced out by the value of the comparison frequency of the loop. It is possible to generate frequency steps which are a fraction of this comparison frequency by using the divider in fractional mode. In this mode, after statically setting the N division ratio, this ratio is made to progress dynamically at the rhythm of the comparison frequency.

It is therefore worthwhile to design a divider with a capacity for the dynamic variation of its division ratio. This dynamic variation is generally achieved with values equal to some units. For example, the divider by N can vary dynamically by the five values N, N+1, N+2, N+3 and N+4, i.e. $\Delta N$ can take the values 0 to 4. Thus, for the phase-locked loop, an apparent division ratio $N_{mean}$ is obtained. This apparent division ratio depends on the sequence of variation of N. For example, if the division is done alternately by N and N+1, then $N_{mean}$ is equal to N+½.

The operation of the phase comparator of the phase-locked loop dictates duty cycle constraints for the signal coming from the divider.

Since the output signal from the divider has a high state and a low state, the following duty cycle constraints may be considered: for example, should one of the two states (high or low) of the output signal of the divider have a constant duration independent of $\Delta N$, then:

When ($N_{mean}$) is an even-parity value, this constant duration is equal to $T_e*(N_{mean})/2$ where $T_e$ is the period of the input signal of the divider, When ($N_{mean}$) is an odd-parity value, this duration is the value closest to $T_e*(N_{mean})/2$ where $T_e$ is the period of the input signal of the divider.

2. Description of the Prior Art

FIG. 1 is a schematic view of the structure of a prior art frequency divider. It is formed by an input divider or prescaler 1 which divides the input frequency $F_e$ by Na or by Na+1, a first counter 2 whose output TC commands the prescaler division by Na or Na+1, a second counter 3 whose output TC is the output of the device. Such a structure has especially the following drawbacks:

The counters 2 and 3 are synchronous counters for which all the stages must work at a high frequency equal to $F_e/Na$, The implementation of the fractional modes is not easy, The number of logic layers between the input and the output is generally great, thus restricting phase noise performance.

The invention pertains to method and device of frequency division used especially to meet the need for dynamic variation of the N division ratio and for full control over the high and low states of the output signal of the divider.

The description makes use of the different definitions given here below.

The term "prescaler" is used to designate a divider that is placed at the front end of a division chain, generally has a simple structure and works at high speed.

The expressions "dynamic variation" or "static variation" of the division ratio are also defined below in the context of the present invention.

For any unspecified divider, two modes of variation of its division ratio may be envisaged.

1—In the dynamic variation mode, the passage from a division ratio $N_1$ to a division ratio $N_2$ is made without loss of continuity in the counting of the periods of the input signal $F_e$. FIG. 2 is a timing diagram showing the dynamic switching of a divider. $F_e$ is the input frequency of the divider. The active edges of $F_e$ are numbered in the figure. The edges 1, 4, 6 correspond to a start of the cycle of the divider: on these edges, the divider takes account of the value of the command which will determine the duration of the output cycle. An output cycle is counted between two rising edges of the output signal $F_s$. The diagram shows that the output cycles are joined together in perfect continuity without any lapse of time between them: this is what characterizes the dynamic switching of N.

2—When the output cycles of the divider are not joined in perfect continuity during the changes in division ratio, then the term "static switching" is used: the divider asks for a certain period of time to change its division ratio, and the changes in state that occur during this lapse of time are not always predictable.

In the description, the words "frames" and "cycles" designate two different notions explained here below.

For an $N_1$ ratio divider, dynamically variable in response to the command C, the division of an input signal with a frequency $F_e$ gives the output signal $F_{S1}$. A counting cycle of the divider has a duration equal to $N_1$ periods of $F_e$ and is constituted by only one high state and only one low state. The counting frame of the divider designates a sequence of cycles $F_{S1}$, and the duration $N_1*T_e$ of each cycle is variable. The duration of this frame depends on the frame of the commands C. If the frame of the commands C is formed by X values, then the frame of $F_{S1}$, has X cycles, each with a controlled duration.

A clear distinction must therefore be drawn between the frame of the commands of the divider and the counting frame: the command frame designates the sequence of the division values used to obtained the desired duration for the counting frame.

As shown in FIG. 3, the duration of the command frame may be different from the duration of the counting frame if the command is taken into account with a delay. In the timing diagram of FIG. 3, the period of the frames consists of two values. The passage from a command frame [2; 3] to a command frame [4; 2] is shown. A counting frame is obtained with a duration passing from $5T_e$ to $6T_e$, but this is not the case of the command frame which goes from 5Te to 7Te and then to 6Te.

SUMMARY OF THE INVENTION

The invention relates to a frequency divider with a division ratio N comprising at least the following elements:
- an input divider with a division ratio $N_{PS}$ receiving a frequency $F_e$ at input and delivering a signal $F_{PS}$ to an insertion/substitution divider,
- the insertion/substitution divider having an input $\Delta N$ of variation of the division ratio N, delivering a command frame C to the input divider (with a rhythm of one value per $F_{PS}$ cycle) and generating an end-of-count signal TC3,
- the insertion/substitution divider being adapted to the insertion of one or more input divider cycles and/or the substitution of an input divider cycle in the command frame C.

The values of the division ratio $N_{PS}$ of the input divider vary, for example, on one octave.

The device may comprise a decoding device and an additional divider delivering a data sequence R×4 and an end-of-count signal TC4 to the insertion/substitution divider, the additional divider receiving static commands from the decoding device.

It may comprise a synchronous output device receiving at least the input frequency $F_e$, the signal $F_{PS}$, the end-of-count signal TC3 coming from the insertion/substitution divider, a signal to control the high and low states of the synchronous output $F_{SY}$.

The input divider comprises, for example, three D flip-flop or flip-flop circuits and, during one period of $F_e$ and per cycle of $F_{PS}$, one of the three flip-flop circuits commands the loading of the three flip-flop circuits.

The input divider may comprise three flip-flop circuits, and the output of at least one of the flip-flop circuits is linked, for example, with the input of one or more of the three flip-flop circuits through one multiplexer only.

The invention also relates to a method to divide a frequency $F_e$ comprising at least one step of division of the frequency $F_e$ by means of an $N_{PS}$ division ratio, the value of this division ratio being commanded by a command bus C modified by substitution of a cycle and/or the insertion of one or more cycles into the counting frame.

The invention has especially the following advantages:
- The device is optimal in terms of phase noise, it has for example only one logic flip-flop circuit between the input $F_e$ and the output $F_{SY}$.
- the range of programming by the user of the N division ratio is on several octaves with a minimum ratio equal to some units,
- N may vary dynamically by a value $\Delta N$ while at the same time controlling the duration of one of the two states of the output signal. This makes it possible to meet the requirement arising from the use of this divider in multiple-fractional-step PLLs (Phase Locked Loops) the term "multiple" being associated with the fact that the maximum variation $\Delta N$ is equal to several units.

BRIEF DESCRIPTION OF THE DRAWINGS

Other features and advantages of the present invention shall appear more clearly from the following description of an exemplary embodiment given by way of an illustration that in no way restricts the scope of the invention, along with the appended figures, of which:

FIG. 5 is an example of a diagram of a 2/3/4 input divider, FIGS. 6A and 6B are a table and a timing diagram representing the high and low states of the input divider of FIG. 5, FIGS. 7 and 8 are two examples of embodiments of parts of the input divider of FIG. 5, FIG. 10 is a table giving the substitutions and insertions of cycles obtained with the configuration of the input divider of FIG. 5, followed by the insertion/substitution divider of FIG. 9;

MORE DETAILED DESCRIPTION

Figure 1:
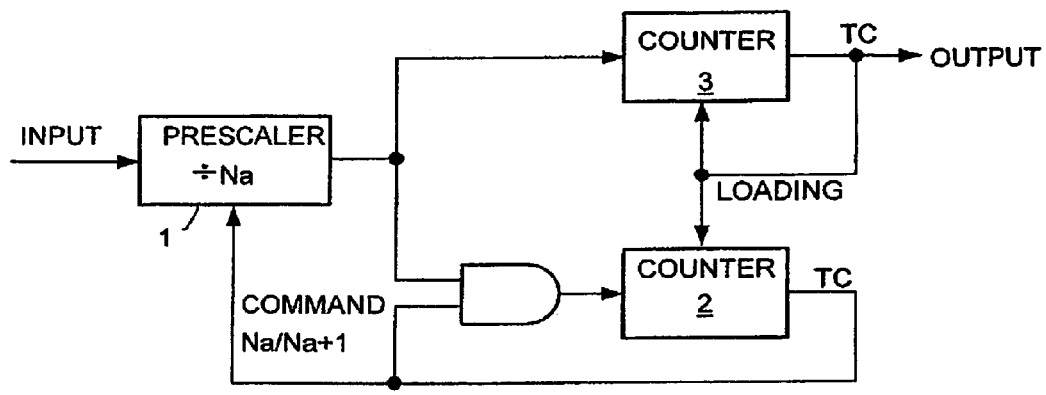
FIG. 1 is a block diagram of a prior art frequency divider.
Figure 2:
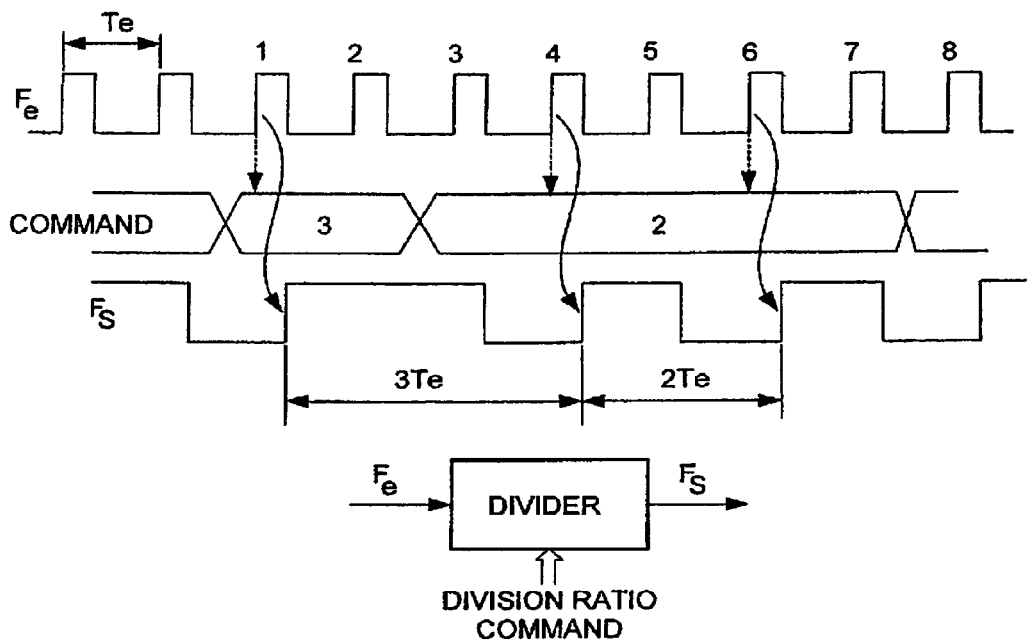
FIG. 2 is a timing diagram showing the dynamic switching of the divider.
Figure 3:
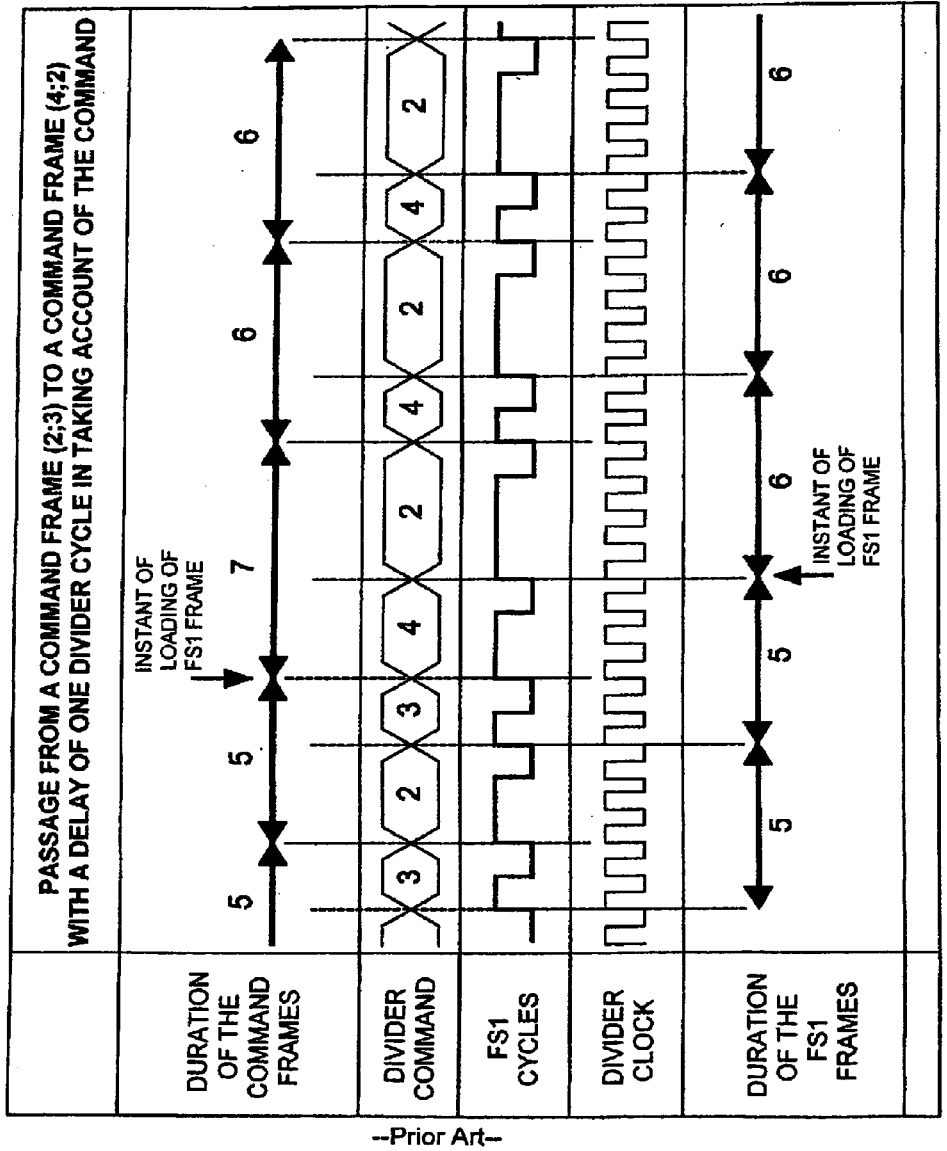
FIG. 3 exemplifies a passage from a frame (2; 3) to a frame (4; 2)
Figure 4:
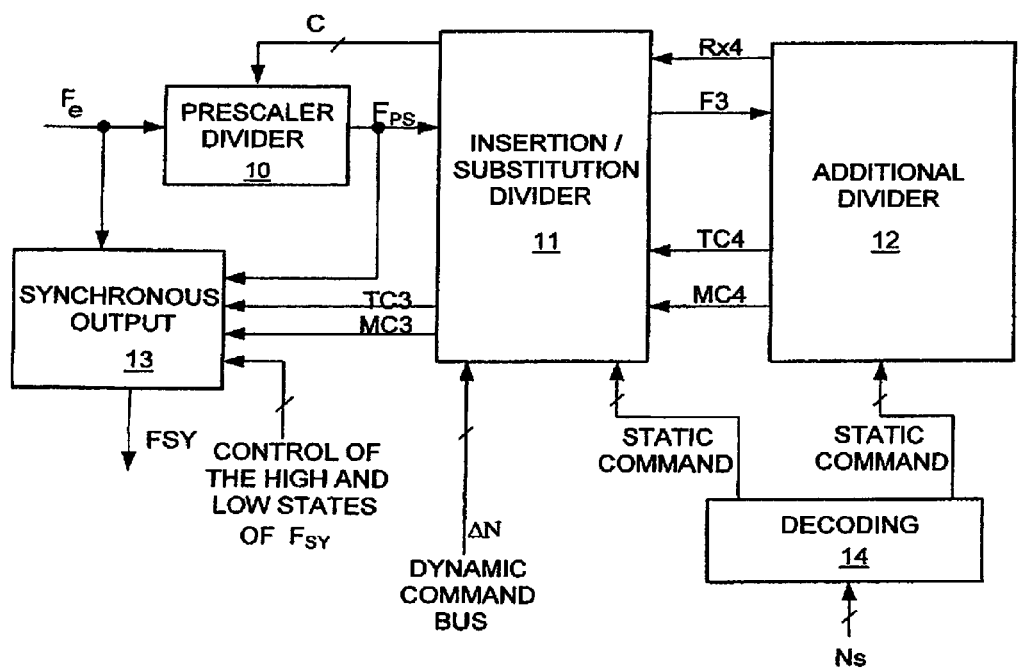
FIG. 4 is a block diagram of an example of a frequency divider according to the invention.

FIG. 4 exemplifies an architecture of a frequency divider according to the invention formed, for example, by five blocks.
- an input divider block placed at the front-end of the division chain or prescaler divider 10
- an insertion/substitution divider block 11
- an additional divider block 12
- a synchronous output block 13
- a decoding block 14.

The set works in the manner described here below. The blocks and their function are themselves described in detail. The division ratio N of the set thus formed is defined as $N=Ns+\Delta N$ where Ns is the static part of N and $\Delta N$ is the requested variation.

The input signal $F_e$ is divided by the value of the division ratio $N_{PS}$ of the input divider 10 which delivers the signal $F_{PS}$ to the insertion/substitution divider 11. $N_{PS}$ may take, for example, all the values in an octave from A to 2A, in response to a bus of commands C coming from the insertion/substitution divider 11.

The insertion/substitution divider 11 possesses, for example, P consecutive division ratios NI including at least the ratios 2 and 3 (P is therefore greater than or equal to 2). In particular, it has the function, firstly, of preparing the frame of the commands C of the input divider from a sequence R×4 coming from the additional divider 12, secondly of taking account of the dynamic requests for variation $\Delta N$ (coming from a command bus for example) by modifying the frame of commands C of the input divider by the substitution of a cycle and/or the insertion of one or more additional cycles in the counting frame, for example (P−1) additional input divider cycles, in causing a variation of the division ratio NI of the insertion/substitution divider. Each inserted or substituted cycle comprises one or more periods of Fe. The sequence R×4 is independent of $\Delta N$. This simplifies the device by restricting the dynamic switching requirement to the insertion/substitution and input dividers alone. The insertion/substitution divider also receives the end-of-count commands TC4 and mid-count commands MC4 from the additional divider, commands (for circuit parametrization) static data and the dynamic command bus $\Delta N$ whose functions are explained here below.

The output of the insertion/substitution divider 11 is the signal $F_3$ (equal to $F_{PS}/NI$) which is also the clock input of the additional divider 12. The insertion/substitution divider also delivers the signals TC3 and MC3 described here below.

The additional divider 12 receives the signal $F_3$ and responds to this signal by the signal R×4, which has the same or substantially the same rhythm as $F_3$, with one value per cycle of $F_3$, and is formed by a periodic sequence of logic values. This additional divider 12 also gives:

The signal TC4 which reports the end of count by the additional divider,

As the case may be, a signal MC4 which reports the point of mid-count by the additional divider. It offers especially an additional possibility in terms of control of the high and low logic states of the output signal from the synchronous block 13.

From these two signals, TC4 and MC4, the insertion/substitution divider respectively generates the signals TC3 and MC3 which respectively report the end-of-count and the point of mid-count of the set of the two dividers: the insertion/substitution divider 11 and the additional divider 12.

The synchronous block 13 has the function especially of unambiguously synchronizing the transitions of the output cycle (of the totality of the divider) with the input frequency $F_e$ of the divider while imposing, for example, only one logic flip-flop circuit between the clock $F_e$ and the output $F_{SY}$. This maximizes phase noise performance. Its inputs are especially the signals TC3, MC3, the control bus signals relating to the high and low states of $F_{SY}$, the divided frequency $F_{PS}$ and the input frequency $F_e$. For an input frequency $F_e$ of 10 GHz and a ratio N of 10,000, the term <<unambiguously>> corresponds to the fact that the position of the output signal with a frequency 1 MHz, is known with a precision of over 100 ps (picoseconds), with a possible offset that is independent of Ns (Ns corresponds to the static part of the division ratio ) and of ΔN relative to the edge of $F_e$ which is the source of the beginning of the counting frame. The output signal consists of only one cycle, namely only one high state and only one low state. The synchronous output block 13 is, for example, configurable so as to enable two modes:

In a first mode, the output cycle corresponds to a single counting frame. The start and the end of the cycle are identified by the signal TC3. MC3 enables the generation of the intermediate transition (between the high state and the low state of $F_{SY}$). In adjusting the delay of MC3 relative to TC3, the duty cycle of $F_{SY}$ is adjusted.

In a second mode, each state of the output cycle corresponds to one or more counting frames. Thus, the duty cycle can be made to vary by adjusting the number and duration of each counting frame for both states of $F_{SY}$. In this mode, only the signal TC3 is used. This mode also augments the range of division ratios that can be achieved: this constitutes an extension of N.

FIGS. 5 to 13 give a detailed example of the architecture of a device according to the invention and its operation, for which the input divider 10 has the function of dividing by the ratios 2, 3 and 4, the insertion/substitution divider 11 divides by ratios 2 and 3 and the additional divider 12 has a structure called a "funnel" structure, for example of the kind described here below or in the patent application FR 03/01485 by the present applicant.

Input Divider or Prescaler

The input divider has a command bus which can be used to vary the division ratio $N_{PS}$ dynamically, i.e. with continuity in the counting. This division ratio has, for example, a capacity of variation on one octave, i.e. it can take all the values between A and 2A. For A=2, the control bus has two binary wires and the ratio $N_{PS}$ may take the values 2, 3 and 4.

In order to generate a synchronous output by a method of unambiguous resynchronization of the transitions of the output signal, the signal $F_{PS}=F_e/N_{PS}$ is chosen so that it possesses a state of constant duration equal, for example, to a single period of the input signal $F_e$. This constant or substantially constant state is for example located at the end of the cycle of the input divider. If we choose a convention where the beginning of the input divider cycle starts with a rising edge, then there should be a low state with a duration equal to a period of $F_e$ that will be situated at the end of the cycle.

FIG. 5 gives a schematic view of an exemplary architecture for the input divider or 2/3/4 prescaler, making it possible especially to meet the duty cycle requirement referred to here above.

The divider comprises, for example, three D flip-flop circuits referenced D1, D2, D3 whose outputs are referenced Q1, Q2 and Q3. Q1 is the output of the input divider The input signals P1 and P2 are used to command the division ratio. This is the optimum scheme in terms of operating frequency because the looped paths between the output Qi of at least one of the three D flip-flop circuits and the input of another D flip-flop circuit include, in normal operation, only one multiplexer which is generally integrated or capable of being integrated into the D flip-flop circuits in most technologies. Any flip-flop circuit having an output that stores the input value at the instant of clock transition (positive clock edge or negative clock edge) may be used.

Another characteristic of this input stage is that one of the three flip-flop circuits, Q3 in this example, commands the loading of the three flip-flop circuits during one single period of $F_e$ per cycle of $F_{PS}$.

The logic relationships between P1, P2 and the components C1, C2 of the command bus C of the input divider are for example:

$P1=C1.or.C2$ $P2=(C1.and.C2).or.(\overline{C1}.and.\overline{C2})$

Figure 7:
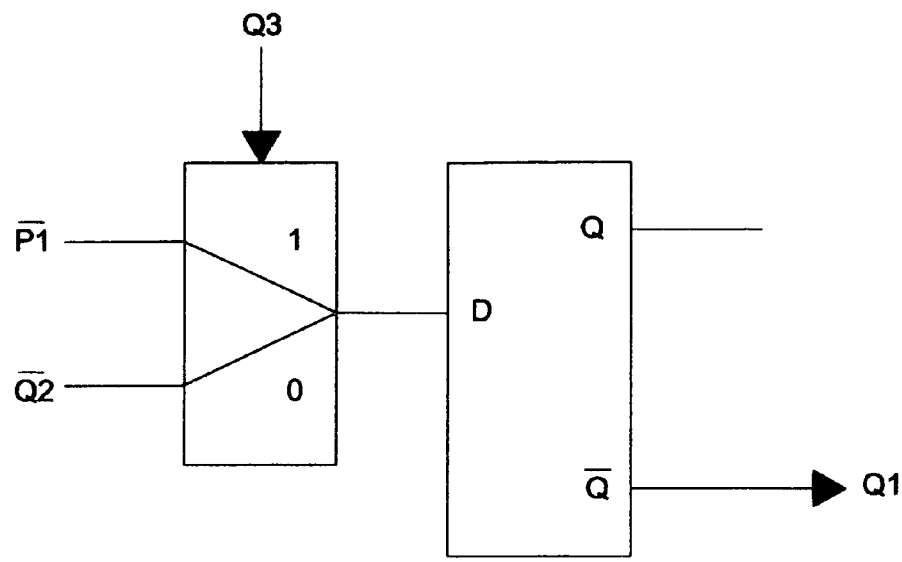
Figure 8:
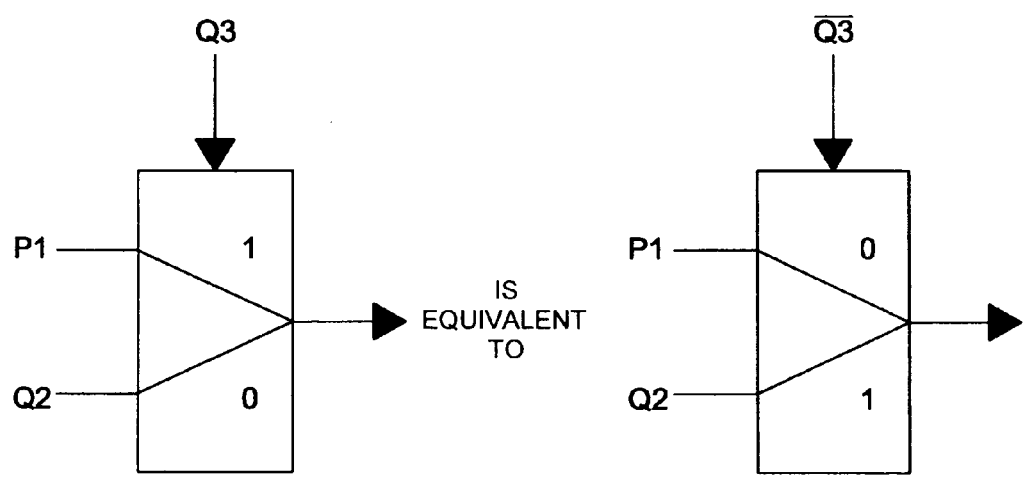

FIG. 7 is a schematic view of another variant where one or more parts of the scheme of FIG. 5 are obtained by complementing, for example, the inputs and the outputs of the flip-flop circuits. FIG. 8 represents an embodiment in which the control signal is inverted on one or more multiplexers.

Table 1 of FIG. 6A gives the duration of the high and low states for each division ratio and FIG. 6B is a timing diagram showing that the state of constant duration is located at the end of the cycle of the 2/3/4 prescaler.

Insertion/Substitution Divider

This divider receives the request for the variation ΔN desired by the user. The insertion/substitution divider then prepares the command frame C pertaining to the commands of the input divider and enables the dynamic modification of this frame.

The alteration of the division ratio N is made, for example, as follows:

The replacement, in the frame, of an input divider cycle (prescaler cycle) by another cycle with a different duration or The insertion, in the frame, of one or more additional divider cycles (prescaler cycles), or The combining of the above two operations, i.e. the insertion of one or more additional cycles and the substitution of an input divider cycle (prescaler cycle).

The choice between these three possibilities is made, for example, as a function of the value ΔN to be obtained and of the value of the command C before alteration:

The following example illustrates a way to choose the alteration of the division ratio.

For an input divider working at the division ratios 2/3/4 and an insertion/substitution divider working at the division ratios 2 and 3, the table of FIG. 10 gives a view, by way of an illustration that in no way restricts the scope of the invention, of the durations of the input divider cycles (prescaler cycles) before and after the process of insertion/substitution of cycles.

The method of insertion/substitution is performed at least once per counting frame of the divider. This method is activated by the end-of-count signal TC4 of the supplementary divider.

Figure 9:
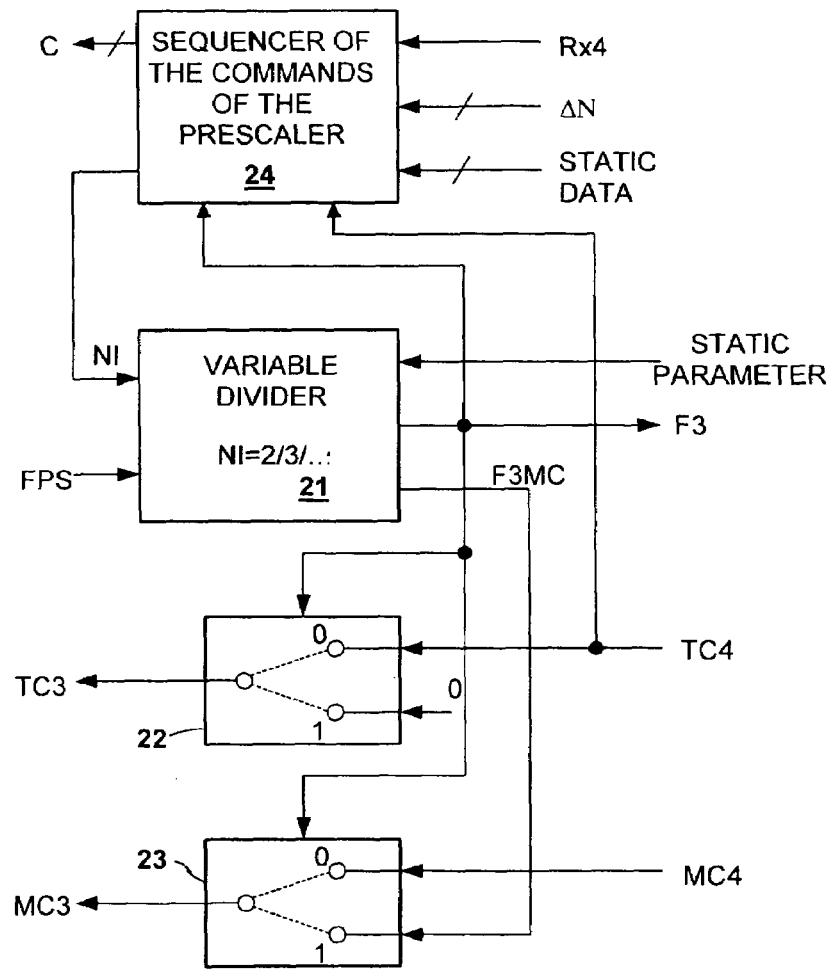
FIG. 9 is a block diagram of an insertion/substitution divider.

FIG. 9 gives a schematic view of an exemplary insertion/substitution divider comprising:

A variable divider 21 with a division ratio NI taking at least the values 2 and 3. This divider receives the signal $F_{PS}$ and delivers the divided signal $F_3$.

A gating means 22 receiving the end-of-count signal TC4 from the additional divider, said signal TC4 being gated by the signal $F_3$ to give the signal TC3 which reports the end-of-count of the set constituted by the "insertion/substitution divider and additional divider".

A multiplexing means 23 which prepares the mid-count signal MC3 from the mid-count signal MC4 given by the additional divider and from F3MC given by the NI ratio divider. F3MC is used to initialize the mid-count signal MC3 in the particular case where the additional divider is inactive. In the other cases, F3MC is equal to zero.

A sequencer 24 of the commands of the input divider which receives the bus ΔN coming from the user, the sequence R×4 coming from the additional divider and a static data bus coming from the decoding of NS (the static part of the N division ratio). The set of these three data pieces of data is, for example, sequenced by the signals TC4 and F3 to form the command bus C of the input divider. For certain values of ΔN, the sequencer 24 inserts one or more additional input divider cycles: this is implemented, for example, by the sequencer in bringing about a variation in the division ratio NI. This variation is capable of taking place at least once in the counting frame of the divider set.

One of the advantages of this structure is that it interfaces naturally with an additional divider whose structure is of a funnel type.

Figure 11:
FIG. 11 is an example of a timing diagram for the insertion/substitution divider of FIG. 9.

The table of FIG. 11 gives an example of timing diagrams describing the process of insertion and/or substitution of prescaler cycles. It illustrates the working of the sequencer 24 of the previous figure. This example presents the timing diagrams of the bus C during the cycle of $F_3$ when the insertion and/or substitution of cycles is performed. For example, a single cycle of $F_3$ is modified throughout the frame which generally has numerous cycles of $F_3$. In this table, it is during the high state of $F_3$ that the method is executed.

For these timing diagrams, the values $R_1$ and $R_2$ are the static data of the sequencer located in the "insertion/substitution" divider block of FIG. 9. The values $B_1$, $B_2$ et $B_3$ are deduced from the dynamic command bus ΔN. C, and $C_2$ are the bits of the command bus C of the prescaler. The division ratio $N_{PS}$ requested from the input divider is equal to $2+C_1+C_2$. The output signal $F_3$ has a duty cycle which participates in the resynchronization process to prepare the synchronous output. To this end, this signal $F_3$ has a constant duration state situated, for example, at the end of a cycle, this duration being equal to only one period of the input signal FPS.

The table of FIG. 10 gives the substitutions and insertions of cycles made to implement the variation ΔN in the divider of the scheme consisting of a 2/3/4 input stage followed by a 2 and 3 divider.

Additional divider

Figure 12:
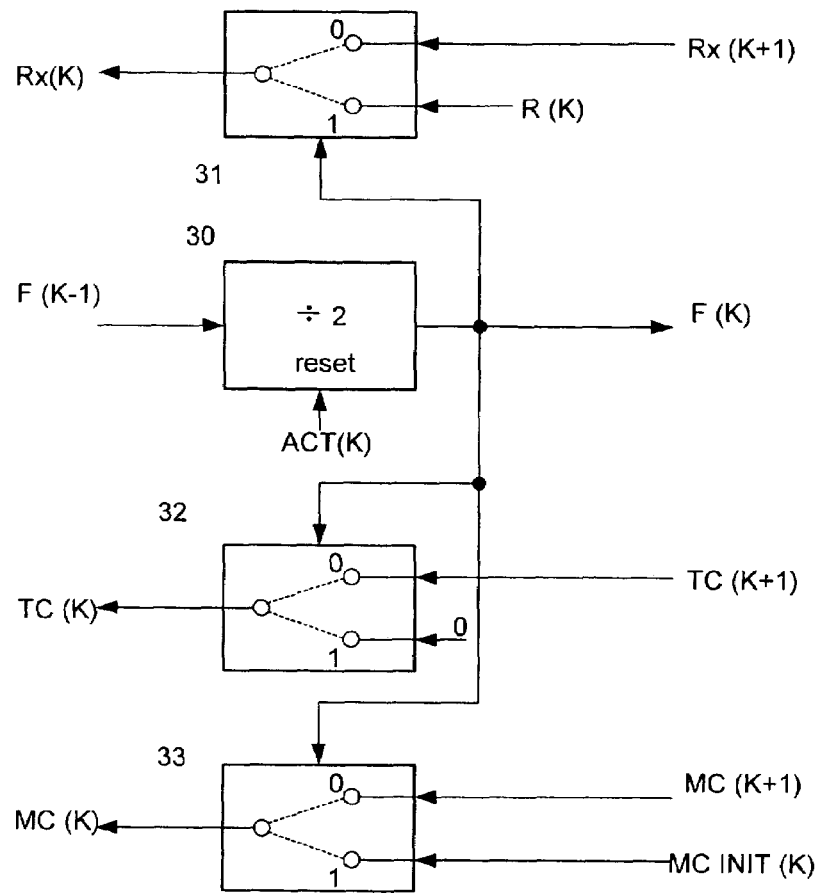
FIG. 12 is a diagram of an additional divider.

The additional divider possesses, for example, a funnel-type structure such as the one described in FIG. 12. Without departing from the framework of the invention, any divider capable of giving a sequence identical to the sequence R×4 as well as an end-of-count signal may be used. The funnel type structure consists of cascade-connected identical stages that are asynchronous (in the sense that the clock signal of one stage is the output of the previous stage).

FIG. 12 is a block diagram of a stage of the additional divider. The number of a stage is identified by the index K, with K=4 for example for the first stage of the additional divider.

Each stage K is characterized by:

A divider by 2, referenced 30, whose input F(K−1) comes from the previous stage K−1 and whose output F(K) is given to the next stage K+1;

A means 31 for the multiplexing of the signals R(K) and R×(K+1) which gives R×(K); the values R×(K) participate in the formation of the sequence R×4;

A gating means 32 for the signal TC(K+1), which reports the end-of-count of the stages with an index greater than or equal to K+1;

A means 33 for the multiplexing of the signals MC(K+1), MCINIT(K) which gives MC(K).

Different Signals are Associated with a Stage K, for Example:

Signals TC(K+1), MC(K+1) and R×(K+1) coming from the next stage K+1.

Signals TC(K), MC(K) and R×(K) given at the previous stage K−1.

Where:

TC(K) reports the end of count of the stages whose index is greater than or equal to K MC(K) reports the point of mid-count of the stages whose index is greater than or equal to K. R×(K) participates in the formation of the sequence R×4.

Static data and commands R(K), ACT(K) and MCINIT (K) by which the user can configure the stage K as a function of the static division ratio Ns to be achieved:

Where:

ACT(K) enables the inhibition of the working of the stage. The set of the values ACT(K) can therefore be used to parametrize the number of active stages of the additional divider, and this determines the period of the sequence R×4. For Y active stages, the sequence R×4 has $2^Y$ values per period. The values R×4 (with the static data of the insertion/substitution divider) determine the durations of the cycles of the input divider which form the counting frame so as to obtain the requested ratio Ns. When all the stages are inactive, R×4 is a constant value.

MCINIT(K) is used to initialize the value of MC(K) when the next stage is inhibited.

The different stages indexed K, K+1, . of the funnel structure carry out the progressive serialization of the static data R(K) coming from the downstream stages of the structure up to the front-end stage of the funnel structure so as to present a sequence of values R×4 synchronous with the clock signal F3 (one value per cycle of F3).

Figure 13:
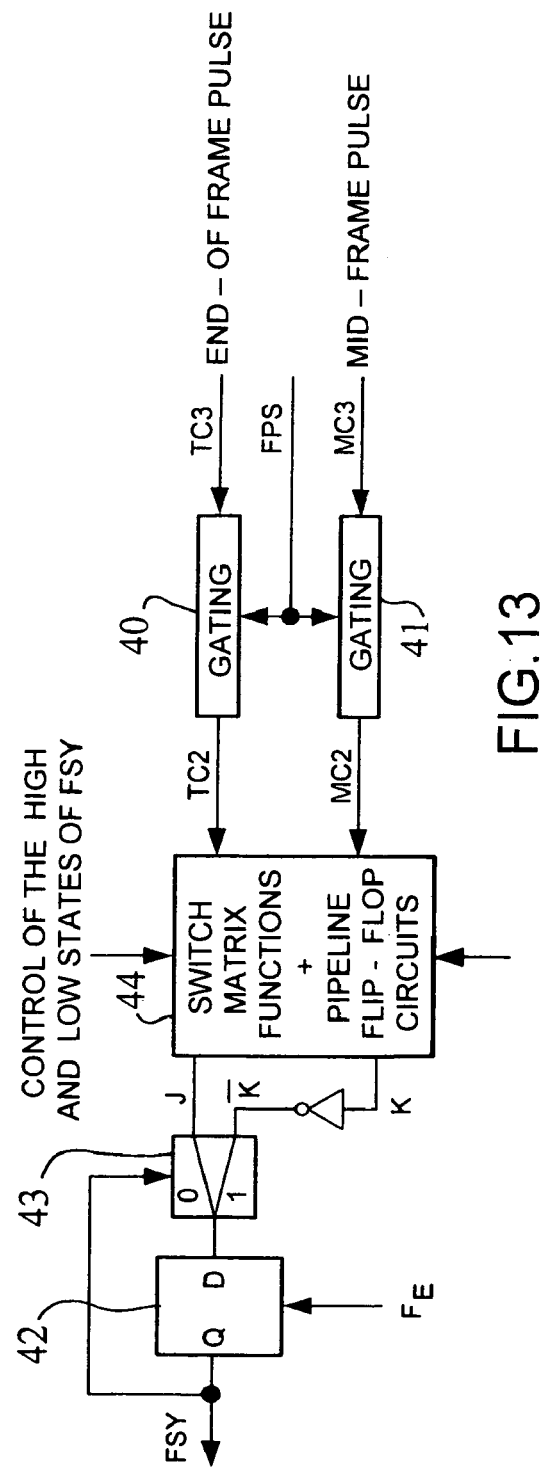
FIG. 13 is an example of a block diagram of a synchronous output block.

We have the following logic equations:

$R \times (K) = (F(K) \text{.and.} R(K)) \text{.or.} (\overline{F(K)} \text{.and.} R \times (K+1))$ $TC(K) = \overline{F(K)} \text{.and.} TC(K+1)$ $MC(K) = (F(K) \text{.and.} MCINIT(K)) \text{.or.} (\overline{F(K)} \text{.and.} MC(K+1))$ Synchronous Output Block FIG. 13 gives a schematic view of a synchronous output block.

This block has the function especially of:

Resynchronizing the transitions of the output cycle on the input frequency $F_e$ of the divider. This resynchronization is possible especially through the making of robust validation windows TC2 and MC2 which select the determined edges of $F_e$, for example the edges of $F_e$ which activate the beginning and the middle of the frame; these windows are made from TC3 and MC3. The robustness is related to the extension, in this block, of the principle of the funnel structure which consists in re-gating the signals TC, MC coming from the downstream stages by means of nested windows having an ever smaller duration as the operation moves upstream;

Controlling the high and/or low states of the output $F_{SY}$.

The synchronous output block comprises, for example, the following elements:

A means 40 for gating TC3, the end-of-frame pulse coming from the insertion/substitution divider, through the state of constant duration of $F_{PS}$. In this way, the signal TC2 resulting from this gating has a duration equal to a period of $F_e$. This means 40, if necessary, comprises one or more pipeline stages (stages of registers used to delay the signal) whose rhythm is set with the clock signal $F_{PS}$ in order to align TC2 in time with the start of the counting frame;

A means 41 for gating MC3 with a structure identical or almost identical to 40 and giving, at output, MC2 whose duration is equal to a period of $F_e$;

A D flip-flop circuit referenced 42, whose output delivers $F_{SY}$. It includes, at its input, a multiplexer 43 commanded by $F_{SY}$. This multiplexer receives the J and K signals which are delivered by the switch matrix function delivered by a set 44;

A set 44 comprising pipeline flip-flop circuits whose rhythm is set with the clock $F_e$ and switch matrix functions. Thus, each of the J and K inputs of the output flip flop circuit can receive the following signals:

TC2 or delayed versions of this signal (through pipeline flip-flop circuits),

MC2 or delayed versions of this signal,

Constant logic levels.

Any device having a function similar to that of a J, K flip-flop device may be used instead of the above-mentioned D flip-flop circuit. The device is optimum in terms of phase noise. It has, for example, only one logic flip-flop circuit between the input $F_e$ and the output $F_{SY}$.

These switch matrix functions may be configured differently from one frame to the next through a bus called a bus for the "control of the high and low states of $F_{SY}$". This enables a great variety of output modes. The switch matrix function is configured by a bus modifiable on the time scale of the frame so as to propose different modes to the user for the synchronous output $F_{SY}$, some non-exhaustive examples of which shall be given here below.

The choice of a mode is made as a function of the application envisaged, as was seen for example in the paragraph giving the requirements of the fractional-step PLLs. Some examples of possible embodiments are described here below. These embodiments are placed, for example, in two categories:

Embodiments that enable the adjusting of the relative durations of the high and low states for the case where the output cycle corresponds to a single counting frame.

Embodiments that enable the choosing of the constant polarity 0 or 1 during the frame modifiable from frame to frame for output cycles consisting of several frames.

In the first category of embodiment, the signal $F_{SY}$, constituted by a high state and a low state, corresponds to a single counting frame. One of the two states is not affected by the variation ΔN: this state therefore depends only on the static ratio Ns. To obtain this embodiment, the signal TC2 is switched to J and the signal MC2 is switched to K (note: according to the principle of resynchronization, both the rising edge and the falling edge of $F_{SY}$ have been resynchronized).

Owing to the building of the signals TC2 and MC2 from TC3 and MC3, we obtain a duty cycle close to 50% (about 50% of Ns*$T_e$ in the high state and 50% of Ns*$T_e$ in the low state, where $T_e$ is the period of the input signal of the divider).

As the case may be, it is possible to delay one of the two signals TC2 or MC2 by one or more periods of $F_e$ (through the pipeline flip-flop circuits of the switch matrix function) so as to modify the duty cycle.

In the second category of embodiment, each state of $F_{SY}$ is formed by one or more frames, and, for each frame, the user programs the value ΔN and polarity 0 or 1.

A frame with polarity 1 is obtained by switching TC2 to J and setting K at 0. A frame with polarity 0 is obtained by switching TC2 to K and setting J at 1. A period of $F_{SY}$, formed by several frames with polarity 1 followed by several frames with polarity 0 gives a new division ratio which may be far greater than the Nmaximum of a single frame of the divider. This synchronous output mode enables the extension (without restriction) of the division ratio as well as the agility capacities (if the period of $F_{SY}$ is formed by X frames, there is a capacity of variation of the division ratio equal to X*ΔN).

In the application to the fractional-step PLLs, it is sought to obtain one of the two states of $F_{SY}$ whose duration is firstly independent of ΔN and secondly close to 50% of $N_{mean}*T_e$. This can be achieved by the combination of the two modes referred to here above.

What is claimed is:

1. A frequency divider with a division ratio N comprising:

an input divider with a division ratio receiving a frequency at input and delivering a signal to an insertion/substitution divider;

the insertion/substitution divider having an input ΔN of variation of the division ratio N, delivering a command frame to the input divider and generating an end-of-count signal;

the insertion/substitution divider being adapted to the insertion of one or more input divider cycles and/or the substitution of an input divider cycle in the command frame; and a decoding device and an additional divider delivering a data sequence and an end-of-count signal to the insertion/substitution divider, the additional divider receiving static commands from the decoding device.

2. The device according to claim 1, wherein the values of the ratio NPs of the input divider vary on one octave.

3. The device according to claim 1, comprising a synchronous output device receiving the input frequency, the signal, the end-of-count signal coming from the insertion/substitution divider, a signal to control the high and low states of the synchronous output.

4. The device according to claim 1, comprising a synchronous output device receiving at least the input frequency Fe, an input frequency of the input divider signal, the end-of-count signal coming from the insertion/substitution divider, a signal to control the high and low states of the synchronous output.

5. The device according to claim 1, wherein the input divider comprises three flip-flop circuits and wherein, during one period of the input frequency and per cycle of the input frequency of the input divider, one of the three flip-flop circuits commands the loading of the three flip-flop circuits.

6. The device according to claim 1, wherein the input divider comprises three flip-flop circuits, and wherein the output of at least one of the flip-flop circuits is linked, with the input of one or more of the three flip-flop circuits through one multiplexer only.

7. The device according to claim 1, wherein the insertion/substitution divider possesses P consecutive division ratios with P greater than or equal to 2.

8. The device according to claim 1, wherein the insertion/substitution divider comprises at least the following elements:
   variable divider with a ratio taking at least the values 2 and 3;
   gating means that receives the end-of-count signal from an additional divider, said signal being gated by the signal coming from the insertion/substitution divider to produce the end-of-count signal; and
   sequencer of the commands of the input divider which receives the bus $\Delta N$ coming from the user, the sequence and a static data bus coming from the decoding of NS.

9. The device according to claim 8, comprising a multiplexing means adapted to preparing a mid-count signal from a mid-count signal MC4 given by the additional divider and/or from an initialization signal given by the ratio divider.

10. The device according to claim 1, wherein the additional divider has a ratio K comprises one divider whose input comes from a previous stage and whose output is given to a next stage, a multiplexing means adapted to preparing a sequence and a gating means adapted to preparing an end-of-count signal.

11. The device according to claim 10, comprising a multiplexing device adapted to preparing a mid-count signal.

12. The device according to claim 3 wherein the synchronous block comprises:
   means for the gating of the end-of-count command and giving, at output, whose duration is equal to a period of the input frequency; and
   output flip-flop circuit delivering the output, comprising, at its input, a multiplexer commanded by the synchronous output.

13. The device according to claim 12, comprising a set having pipeline flip-flop circuits whose rhythm is set with the clock Fe and switch matrix functions.

14. The device according to claim 12, comprising a means for the gating of the mid-count signal, giving at output a signal whose duration is equal to a period of the input frequency.

15. The device according to claim 4, wherein the synchronous block comprises:
   means for the gating of the end-of-count command and giving, at output, whose duration is equal to a period of the input frequency; and
   output flip-flop circuit delivering the output, comprising, at its input, a multiplexer commanded by the synchronous output.

* * * * *